US009076504B2

(12) United States Patent
Lee et al.

(10) Patent No.: US 9,076,504 B2
(45) Date of Patent: Jul. 7, 2015

(54) SEMICONDUCTOR MEMORY DEVICE AND REFRESH METHOD THEREOF

(71) Applicants: Jong-Ho Lee, Seoul (KR); Kyu-Chang Kang, Seoul (KR); Hyo-Chang Kim, Gwangju-si (KR); Jae-Youn Youn, Seoul (KR); Sang-Jae Rhee, Seongnam-si (KR)

(72) Inventors: Jong-Ho Lee, Seoul (KR); Kyu-Chang Kang, Seoul (KR); Hyo-Chang Kim, Gwangju-si (KR); Jae-Youn Youn, Seoul (KR); Sang-Jae Rhee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 319 days.

(21) Appl. No.: 13/661,773

(22) Filed: Oct. 26, 2012

(65) Prior Publication Data

US 2013/0176803 A1 Jul. 11, 2013

(30) Foreign Application Priority Data

Jan. 9, 2012 (KR) .................. 10-2012-0002470

(51) Int. Cl.
G11C 7/08 (2006.01)
G11C 11/406 (2006.01)
G11C 11/4091 (2006.01)

(52) U.S. Cl.
CPC ............ *G11C 7/08* (2013.01); *G11C 11/40626* (2013.01); *G11C 11/4091* (2013.01); *G11C 2211/4065* (2013.01); *G11C 2211/4068* (2013.01)

(58) Field of Classification Search
CPC ........... G11C 11/406; G11C 11/40611; G11C 11/40615; G11C 11/4091; G11C 2211/406; G11C 2211/4061; G11C 2211/4065; G11C 2211/4067; G11C 2211/4068; G11C 7/08; G11C 11/40626

USPC .......................... 365/222, 203, 207, 201, 200
See application file for complete search history.

(56) References Cited

U.S. PATENT DOCUMENTS

| 5,764,580 | A  | * | 6/1998  | Suzuki et al. ................. 365/205 |
| 6,104,656 | A  | * | 8/2000  | Jung ............................. 365/207 |
| 6,344,760 | B1 | * | 2/2002  | Pyo ................................ 327/51 |
| 6,459,627 | B1 | * | 10/2002 | Sakamoto et al. ............ 365/190 |
| 6,459,639 | B2 | * | 10/2002 | Nishimura .................... 365/207 |
| 6,646,283 | B1 | * | 11/2003 | Akimoto et al. .............. 257/30 |
| 6,894,942 | B2 | * | 5/2005  | Cho .............................. 365/222 |
| 7,042,781 | B2 | * | 5/2006  | Kim .............................. 365/205 |
| 7,095,669 | B2 |   | 8/2006  | Oh |
| 7,158,430 | B2 | * | 1/2007  | Byun ............................ 365/205 |
| 7,184,342 | B2 | * | 2/2007  | Seo .............................. 365/203 |
| 7,231,488 | B2 |   | 6/2007  | Poechmueller |
| 2003/0214870 | A1 | * | 11/2003 | Cho ............................ 365/222 |
| 2011/0080797 | A1 |   | 4/2011  | Furutani |

FOREIGN PATENT DOCUMENTS

| KR | 2004-0073165 A | 8/2004 |
| KR | 2005-0106833 A | 11/2005 |
| KR | 2010-0076092 A | 7/2010 |

* cited by examiner

*Primary Examiner* — J. H. Hur
(74) *Attorney, Agent, or Firm* — Muir Patent Law, PLLC

(57) ABSTRACT

A semiconductor memory device and a self-refresh method of the semiconductor memory device. The semiconductor memory device includes: a memory cell array including one or more memory cells; a sense amplifier connected to a sensing line and a complementary sensing line and sensing/amplifying data stored in the one or more memory cells; and a sense amplifier control circuit sequentially supplying a first voltage and a second voltage having different levels to the sense amplifier through the sensing line during a refresh operation.

19 Claims, 11 Drawing Sheets

US 9,076,504 B2

SEMICONDUCTOR MEMORY DEVICE AND REFRESH METHOD THEREOF

CROSS-REFERENCE TO RELATED APPLICATIONS

This application claims the benefit of Korean Patent Application No. 10-2012-0002470, filed on Jan. 9, 2012, in the Korean Intellectual Property Office, the disclosure of which is incorporated herein in its entirety by reference.

BACKGROUND

Example embodiments relate to a semiconductor memory device, and more particularly, a semiconductor memory device having reduced power consumed in a refresh operation and a refresh method of the semiconductor memory device.

A dynamic random access memory (DRAM) as a semiconductor memory device that is mainly used in a system that requires high-speed data transmission includes dynamic cells each including a cell capacitor and a cell transistor. Due to a leakage current generated due to characteristics of the dynamic cells, data stored in the dynamic cells have to be refreshed for each predetermined cycle.

Furthermore, due to the development of mobile devices, various methods of reducing power consumption of semiconductor memory devices each including dynamic cells have been suggested. In particular, among the methods, methods of reducing power consumed in a refresh operation are significant.

SUMMARY

Example embodiments provide a semiconductor memory device.

According to one example embodiment, a semiconductor memory device may include a memory cell array, a sense amplifier, and a sense amplifier control circuit. The memory cell array includes a plurality of memory cells. The sense amplifier is connected to a sensing line and a complementary sensing line and is configured to sense and amplify data stored in at least one of the memory cells. The sense amplifier control circuit is configured to supply a first voltage and sequentially supply a second voltage having a different level from a level of the first voltage to the sense amplifier through the sensing line during a refresh command period of a refresh period.

According to another example embodiment, there is provided a refresh method for a semiconductor memory device comprising a memory cell array. The refresh method includes entering in a second refresh period after a first refresh period, selecting a first memory cell of the memory cell array by activating a word line, performing an amplification operation on a bit line of the first memory cell by sequentially supplying a first voltage and a second voltage having different level from a level of the first voltage to a sense amplifier during a refresh command period of a refresh period, and restoring data in the first memory cell by using voltages applied to the bit line.

According to further example embodiment, there is provided a refresh method for a semiconductor memory device comprising a sense amplifier connected to one or more memory cells. The refresh method includes supplying a first voltage to a sensing line of the sense amplifier during a refresh command period of a first refresh period, and supplying the first voltage and sequentially a second voltage having a different level from a level of the first voltage to the sensing line of the sense amplifier during a refresh command period of a second refresh period longer than the first refresh period.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
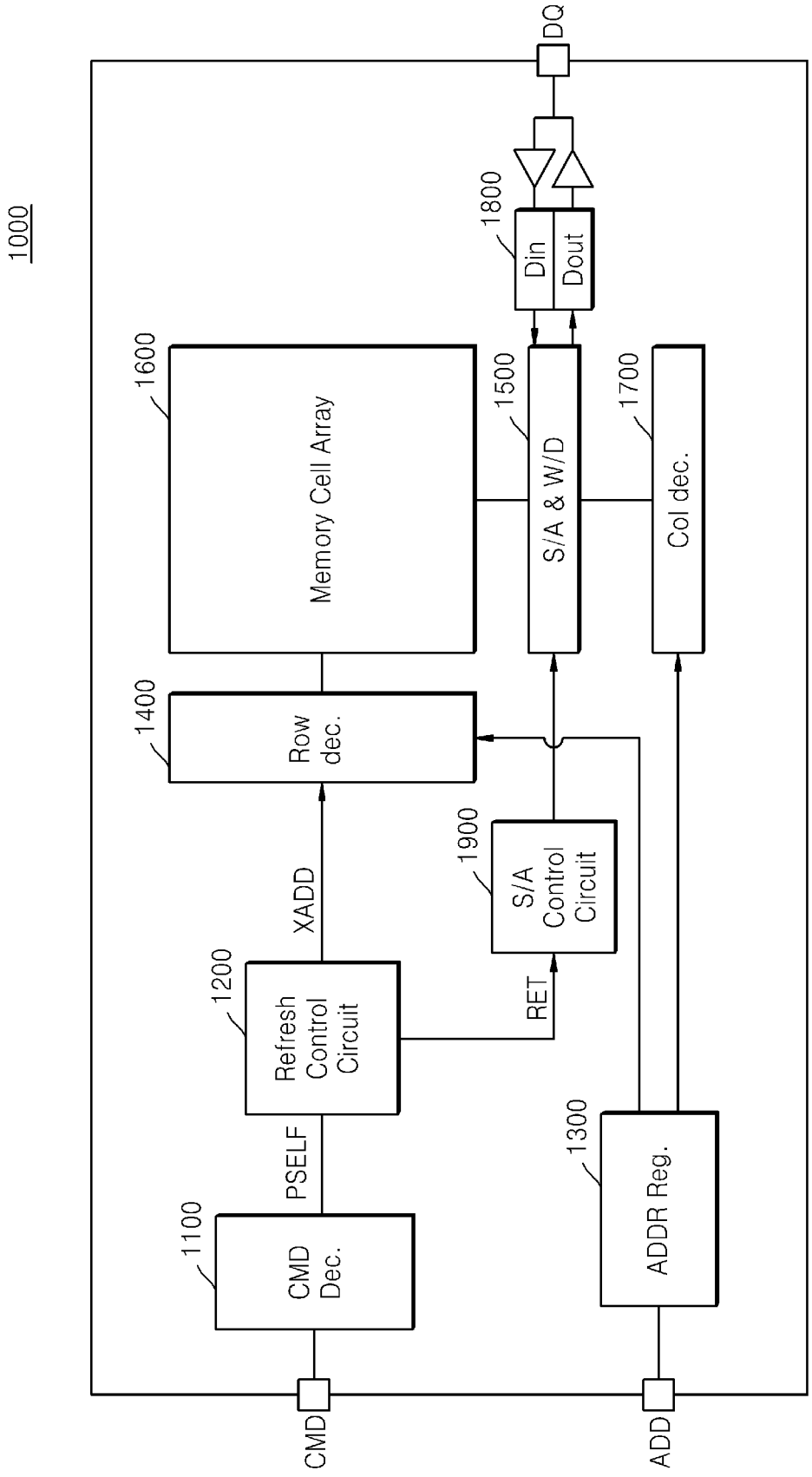
FIG. 1 is a block diagram of a semiconductor memory device according to an embodiment.

Example embodiments will be described more fully with reference to the accompanying drawings. The present disclosure may, however, be embodied in many different forms and should not be construed as limited to the embodiments set forth herein. Like reference numerals in the drawings refer to like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

FIG. 1 is a block diagram of a semiconductor memory device 1000 according to an embodiment. Referring to FIG. 1, the semiconductor memory device 1000 may include a command decoder 1100, a refresh control circuit 1200, an address register 1300, a row decoder 1400, a sense amplifier/writer driver 1500, a memory cell array 1600, a column decoder 1700, a data input/output unit 1800, and a sense amplifier control circuit 1900.

The command decoder 1100 decodes a command CMD input from an external device, for example, a memory controller. The command CMD may include a combination of one or more instructions, and the semiconductor memory device 1000 may enter in a refresh mode in accordance with the combination of instructions. In the present embodiment, a refresh period may include an auto-refresh period or a self-refresh period. For convenience, the self-refresh operation according to embodiments will be described.

The command decoder 1100 decodes the command CMD, generates a self-refresh signal PSELF, and applies the generated self-refresh signal PSELF to the refresh control circuit 1200. The refresh control circuit 1200 controls a refresh operation of the memory cell array 1600 in response to the self-refresh signal PSELF. For example, the refresh control circuit 1200 includes a structure, such as a counter for generating an internal address XADD for performing the refresh operation and outputs the generated internal address XADD as a row address to the row decoder 1400.

The address register 1300 stores an address signal ADD received from the external device, and the stored address signal ADD is transferred to the row decoder 1400 and the column decoder 1700. The address signal ADD may include a row address and a column address. When a normal operation of the semiconductor memory device 1000 is performed, the row address and the column address for accessing a memory cell are received. Alternatively, the row address for selecting an area in which the refresh operation is to be performed may be provided by the external device. In this case, the row address for performing the refresh operation may be provided by the address register 1300 to the row decoder 1400. Although not shown, a selection circuit for selectively outputting the address signal ADD stored in the address register 1300 or outputting the internal address XADD from the refresh control circuit 1200 may be further included in the semiconductor memory device 1000.

When the self-refresh operation is performed, the internal address XADD is generated from the refresh control circuit 1200 and is transferred to the row decoder 1400. In addition, the refresh control circuit 1200 may generate a refresh retention signal RET during the self-refresh operation and may output the generated RET signal to the sense amplifier control circuit 1900. The refresh retention signal RET may generate when one refresh period is finished during the self-refresh operation.

The row decoder 1400 activates word lines corresponding to the row address, and the column decoder 1700 activates bit lines corresponding to the column address.

For example, in the self-refresh mode, when the word lines are activated by the row decoder 1400, data stored in memory cells connected to the activated word lines is sensed and amplified by the sense amplifier/write drive 1500 through the bit lines. In addition, the sensed and amplified data is restored in the memory cells so that the refresh operation may be performed.

The memory cell array 1600 receives write data or outputs read data through the sense amplifier/write driver 1500 according to the result of decoding by the row decoder 1400 and the column decoder 1700. The memory cell array 1600 may include a plurality of banks (not shown), and each of the plurality of banks includes a plurality of word lines, a plurality of bit lines, and memory cells formed in a portion where the plurality of word lines and the plurality of bit lines cross each other.

Input/output data DQ is provided internally to the semiconductor memory device 1000 or is output to the external device via the data input/output circuit 1800. For example, the input data DQ is written into the memory cell array 1600 based on an address stored in the address register 1300, or output data DQ read from the memory cell array 1600 is output to the external device via the data input/output circuit 1800.

Figure 2:
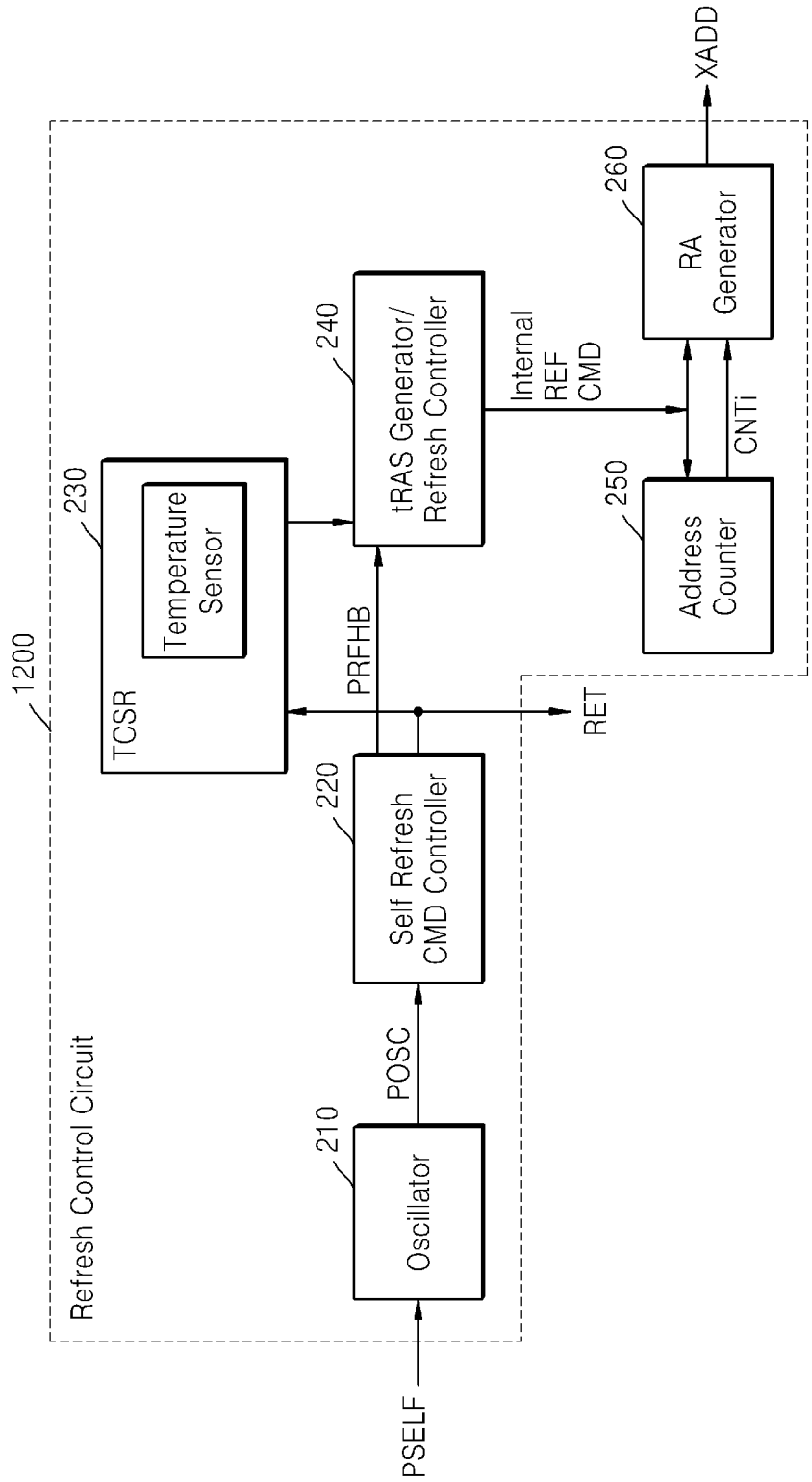
FIG. 2 is a block diagram of a refresh control circuit of FIG. 1, according to an embodiment.

FIG. 2 is a block diagram of the refresh control circuit 1200 of FIG. 1, according to an embodiment. Referring to FIG. 2, the refresh control circuit 1200 may include an oscillator 210, a self-refresh command controller 220, a temperature-compensated self-refresh (TCSR) circuit 230, a tRAS generator/refresh controller 240, an address counter 250, and a row address generator 260.

The refresh control circuit 1200 controls a self-refresh operation of the semiconductor memory device 1000 in response to the self-refresh signal PSELF applied by the command decoder 1100.

The oscillator 210 generates a refresh period pulse POSC in the semiconductor memory device 1000 in a predetermined period in accordance with intrinsic refresh characteristics, i.e., a refresh period, a refresh cycle, etc., of the semiconductor memory device 1000.

The self-refresh command controller 220 generates a refresh control signal PRFHB in response to the self-refresh signal PSELF generated by the command decoder 1100 and/or the refresh period pulse POSC generated by the oscillator 210. Furthermore, the self-refresh command controller 220 may determine whether the refresh operation of all memory cells of the memory cell array 1600, for example, whether one refresh period is completed, has been performed by counting the refresh period pulse POSC. The self-refresh command controller 220 generates the refresh retention signal RET according to the determination result and applies the refresh retention signal RET to the TCSR circuit 230 and to the external device.

The TCSR circuit 230 varies the refresh period in accordance with an ambient temperature in order to increase an efficiency of the self-refresh operation. That is, the TCSR circuit 230 may include a temperature sensor, may measure the internal temperature of the semiconductor memory device 1000, and set the most optimized period in accordance with the measured internal temperature. In addition, the refresh period may vary using the refresh retention signal RET in accordance with the refresh period.

The tRAS generator/refresh controller 240 generates an internal refresh command REF CMD by using the refresh control signal PRFHB. In addition, when the internal refresh command REF CMD is generated, a period of the internal refresh command REF CMD may be adjusted using temperature information received from the TCSR circuit 230. Although not shown in FIG. 2, the refresh retention signal RET from the self-refresh command controller 220 may be directly applied to the tRAS generator/refresh controller 240 and may be used in adjusting the period of the internal refresh command REF CMD. The internal refresh command may be supplied to the address counter 250 and/or the row address generator 260.

The address counter 250 performs a counting operation in response to the internal refresh command REF CMD and supplies a counting result CNTi to the row address generator 260. The row address generator 260 generates the row address XADD as the internal address XADD for the refresh operation by using the internal refresh command REF CMD and/or the counting result CNTi from the address counter 250. When the self-refresh operation is performed, the row address XADD is supplied to the row decoder 1400 from the row address generator 260.

Figure 3:
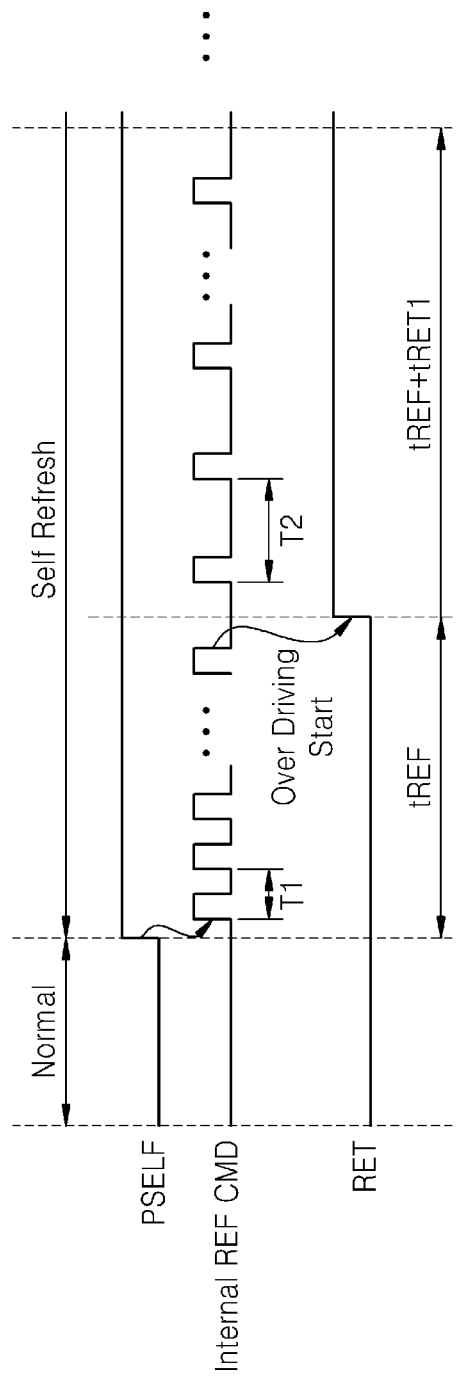
FIG. 3 is a timing diagram of waveforms of signals related to a self-refresh operation, according to an embodiment.

FIG. 3 is a timing diagram of waveforms of signals related to a self-refresh operation, according to an embodiment. When the semiconductor memory device 1000 is in a normal mode, the self-refresh signal PSELF may be at a 'low' level, and when the self-refresh signal PSELF is changed to a 'high' level from the 'low' level, the semiconductor memory device 1000 may enter the self-refresh mode.

The row address for performing the self-refresh operation is output by the row address generator 260 for each predetermined address generation period, and word lines corresponding to the output row address are activated. Subsequently, a series of operations of sensing and amplifying data stored in memory cells connected to the activated word lines and restoring the amplified data in the memory cells are performed.

Referring to FIG. 3, the self-refresh operation may include one or more self-refresh periods. For example, the self-refresh operation may include a first self-refresh period tREF and a second self-refresh period tREF+tRET1. Here, the self-refresh period refers to a section where all word lines to be self-refreshed are refreshed each one time from a starting word line to a last word line. The first self-refresh period tREF and the second self-refresh period tREF+tRET1 may be different refresh periods.

In the self-refresh period, the internal address XADD or the row address for the self-refresh operation is generated in accordance with the internal REF CMD, and a period in which the internal REF CMD (referred to herein as a refresh command period, and shown, for example as T1 or T2) is generated and a period in which the row address is generated may be substantially the same. The first self-refresh period tREF includes a number of refresh command periods each refresh command period referring to T1 and the second self-refresh period tREF+tRET1 may include the same number of refresh command periods each refresh command period referring to T2 longer than T1. Assuming that the period in which the internal REF CMD is generated and the period in which the row address is generated are the same, since the second self-refresh period tREF+tRET1 is longer than the first self-refresh period, the period T2 in which the row address is generated may be further increased in the second self-refresh period tREF+tRET1 rather than in the first self-refresh period tREF.

Before performing the refresh operation, the memory cell array 1600 has non-uniform voltage levels between the memory cells due to a coupling effect of word lines/bit lines that is generated during a write or read operation. In this case, by performing a first self-refresh operation, the voltage levels between the memory cells may be made uniform, and the first self-refresh operation may be defined as one that changes dynamic components of the memory cells into static components.

By changing the dynamic components of the memory cells into the static components, a period of a next self-refresh operation may be increased so that a current consumption is reduced during the self-refresh operation. In addition, as the period of the second self-refresh period tREF+tRET1 is increased, in order to prevent failure from occurring due to a loss of data stored in the memory cells, over-driving may be performed while the amplified data applied to bit lines during the self-refresh operation is restored in the memory cells. Detailed descriptions of the over-driving operation will be described below.

When the first self-refresh period tREF is completed, the self-refresh command decoder 220 generates the refresh retention signal RET. The second self-refresh period tREF+tRET1 proceeds in response to the refresh retention signal RET. In the second self-refresh period tREF+tRET1, precharge over-driving (POD) may be performed for restoring data in the memory cells. The POD may be performed by increasing the level of a voltage, for example, a developing voltage applied to bit lines in order to restore the data to be larger than a level of a voltage during a normal operation, such as read or write operation.

The POD may be performed in response to a predetermined command, for example, a precharge command CMD input. A restoration of the cell data may be improved by increasing the developing voltage applied to the bit lines compared to the normal operation.

Figure 4:
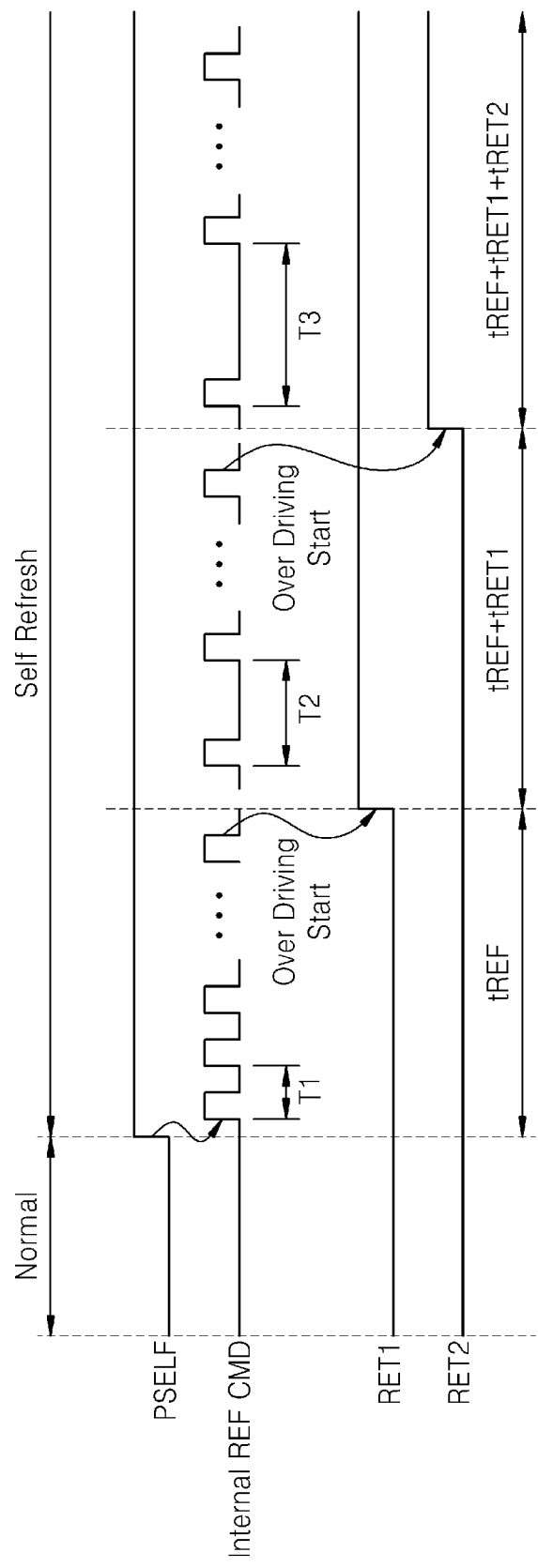
FIG. 4 is a timing diagram of waveforms of signals related to a self-refresh operation, according to another embodiment.

FIG. 4 is a timing diagram of waveforms of signals related to a self-refresh operation, according to another embodiment. Referring to FIG. 4, a period in which the self-refresh operation is performed may be classified into three or more self-refresh periods. For example, FIG. 4 illustrates a first self-refresh period tREF, a second self-refresh period tREF+tRET1, and a third self-refresh period tREF+tRET1+tRET2. In addition, when the self-refresh period is classified into a plurality of periods compared to FIG. 3, a plurality of refresh retention signals may be generated. For example, it is assumed that first and second refresh retention signals RET1 and RET2 are generated.

In the first self-refresh period tREF, a period in which the internal REF CMD or the row address is generated may have a value T1, and dynamic components of the memory cells may be changed into static components by a refresh operation during the first self-refresh period tREF. When the first self-refresh period tREF is completed, the self-refresh command decoder 220 may generate a first refresh retention signal RET1. The second self-refresh period tREF+tRET1 proceeds in response to the first refresh retention signal RET1.

The period of the second self-refresh period tREF+tRET1 has a larger value than that of the first self-refresh period tREF. Thus, the internal REF CMD or the row address generation period T2 of the second self-refresh period tREF+tRET1 may have a larger value than the period T1 of the first self-refresh period tREF. In addition, when data is restored in the second self-refresh period tREF+tRET1, over-driving may be performed. After that, when the second self-refresh period is completed, the self-refresh command decoder 220 generates a second refresh retention signal RET2.

The third self-refresh period tREF+tRET1+tRET2 proceeds in response to the second refresh retention signal RET2. A period of the third self-refresh period tREF+tRET1+tRET2 has a larger value than a period of the second self-refresh period tREF+tRET1. Thus, the internal REF CMD or the row address generation period T3 of the third self-refresh period tREF+tRET1+tRET2 may have a larger value than the period T2 of the second self-refresh period tREF+tRET1. In addition, when data is restored in the third self-refresh period tREF+tRET1+tRET2, over driving may be performed. For example, an amount of the over driving in the third self-refresh period tREF+tRET1+tRET2 may be same as or larger than an amount of the over driving in the second self-refresh period tREF+tRET1.

When the third self-refresh period tREF+tRET1+tRET2 is completed, a fourth self-refresh period (not shown) having a larger period than that of the third self-refresh period tREF+tRET1+tRET2 may be constituted. Alternatively, the refresh operation in the third self-refresh period tREF+tRET1+tRET2 may be repeatedly performed in accordance with a period of the third self-refresh operation.

Referring to Table 1 below, the period of the second self-refresh period tREF+tRET1 and the period of the third self-refresh period tREF+tRET1+tRET2 may be set in various ways.

For example, as in a first embodiment, POD is performed during the refresh operation in the second self-refresh period tREF+tRET1, and the refresh period is increased by about 40% in the third self-refresh period tREF+tRET1+tRET2. Since an internal voltage stored in each memory cell is increased due to the POD operation so that the period of the refresh period to proceed subsequently may be further increased.

In second through fifth embodiments in which the POD operation is applied to the third self-refresh period tREF+tRET1+tRET2, the period of the self-refresh period may be further increased by the POD operation even in a subsequent self-refresh period. An increase in the period of the self-refresh period may be adjusted in consideration of performing the POD operation and a voltage level during the POD operation.

TABLE 1

| Embodiment | Second self-refresh period | Third self-refresh period |
|---|---|---|
| 1 | POD | period (+40%) |
| 2 | POD | POD + period (+40%) |
| 3 | POD | POD + period (+100%) |
| 4 | POD + period (+40%) | POD + period (+40%) |
| 5 | POD + period (+40%) | POD + period (+100%) |

Figure 5:
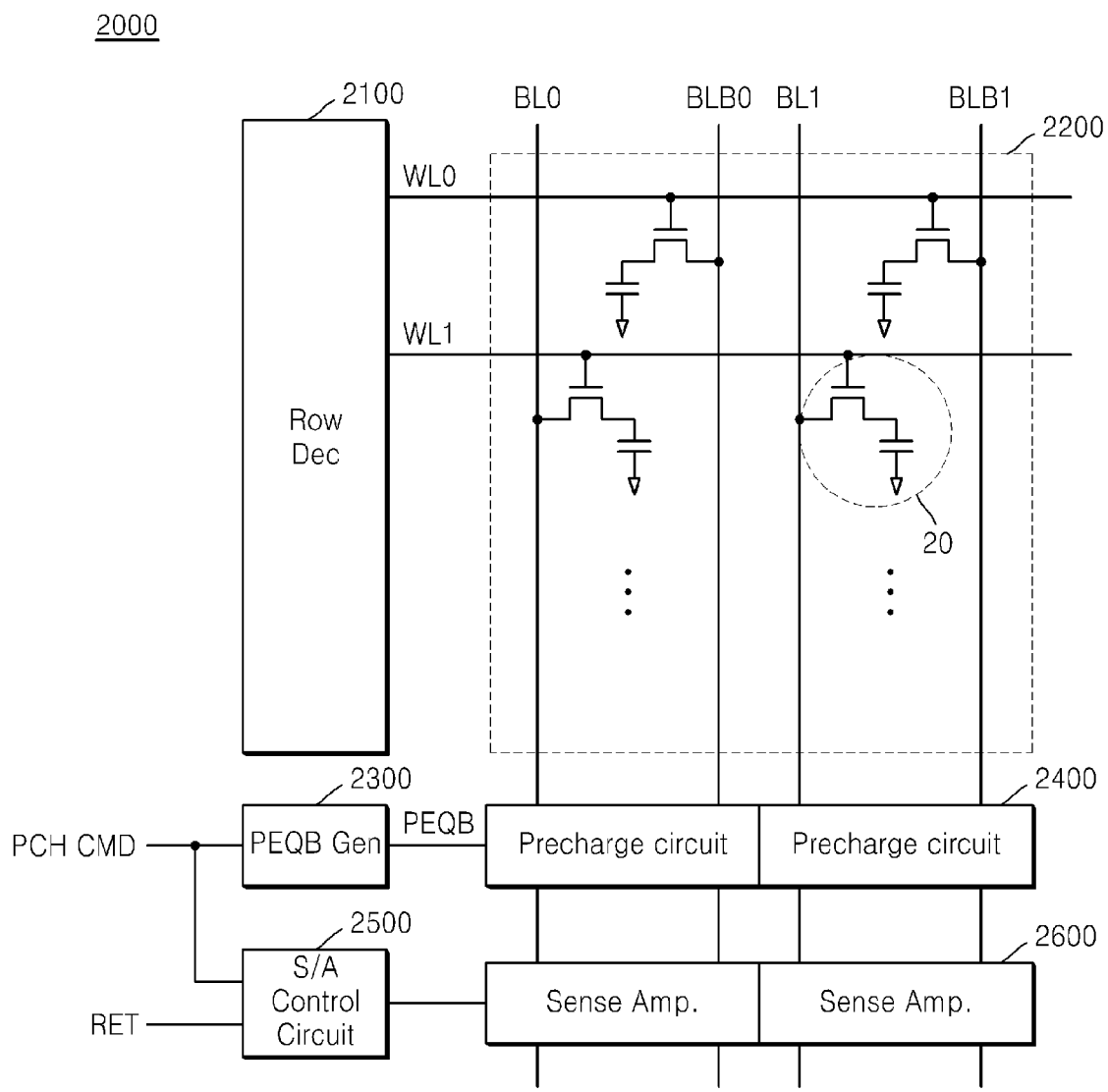
FIG. 5 is a block diagram illustrating a precharge overdriving (POD) operation of a semiconductor memory device, according to an embodiment.

FIG. 5 is a block diagram of a POD operation of a semiconductor memory device 2000, according to an embodiment. Referring to FIG. 5, the semiconductor memory device 2000 includes a row decoder 2100, a memory cell array 2200, a precharge signal generator 2300, a precharge circuit 2400, a sense amplifier control circuit 2500, and a sense amplifier 2600.

The memory cell array 2200 may include a plurality of memory cells 20, and each of the memory cells 20 may include a cell capacitor and a cell transistor. A gate of the cell transistor may be connected to a word line of a plurality of word lines WL0, WL1, . . . , which is arranged in a row direction, and one of a source and a drain of the cell transistor may be connected to one bit line of a plurality of bit lines BL0, BL1, . . . , or one complementary bit line of a plurality of complementary bit lines BLB0, BLB1, . . . , which is arranged in a column direction, and the other one of the source and the drain of the cell transistor may be connected to the cell capacitor.

The precharge signal generator 2300 generates a precharge control signal PEQB by receiving a precharge command PCH CMD from a command decoder (see 1100 of FIG. 1). The precharge circuit 2400 performs a precharge operation of a predetermined precharge voltage, for example, a VBL voltage, through a pair of bit lines by receiving the precharge control signal PEQB.

The sense amplifier 2600 may be disposed on each pair of bit lines and senses and amplifies data stored in the memory cell 20. In addition, the amplified data is provided to the memory cell 20 and is restored in the cell capacitor. In this case, the sense amplifier control circuit 2500 controls a series of operations for performing a data sensing/amplification operation. In addition, according to the present embodiment, the sense amplifier control circuit 2500 may control the POD operation when data is restored in the cell capacitor.

When the semiconductor memory device 2000 is in a self-refresh mode, the sense amplifier control circuit 2500 may control the POD operation in response to one or more signals. For example, the sense amplifier control circuit 2500 may receive the precharge command PCH CMD or a signal generated as a result of delaying the precharge command PCH CMD and may also receive the refresh retention signal RET illustrated in FIG. 1. For example, when, after the first self-refresh period is completed, the refresh retention signal RET is input from a refresh control circuit (see 1200 of FIG. 1), the sense amplifier control circuit 2500 may control the POD operation to be performed for a next refresh period, for example, a second self-refresh period, in response to the refresh retention signal RET. In addition, timing for performing the POD operation during the refresh operation may be determined using the precharge command PCH CMD or the signal generated as a result of delaying the precharge command PCH CMD. That is, performing the POD operation in the self-refresh period may be determined by the refresh retention signal RET, and the POD operation may be actually performed in response to the precharge command PCH CMD.

Figure 6:
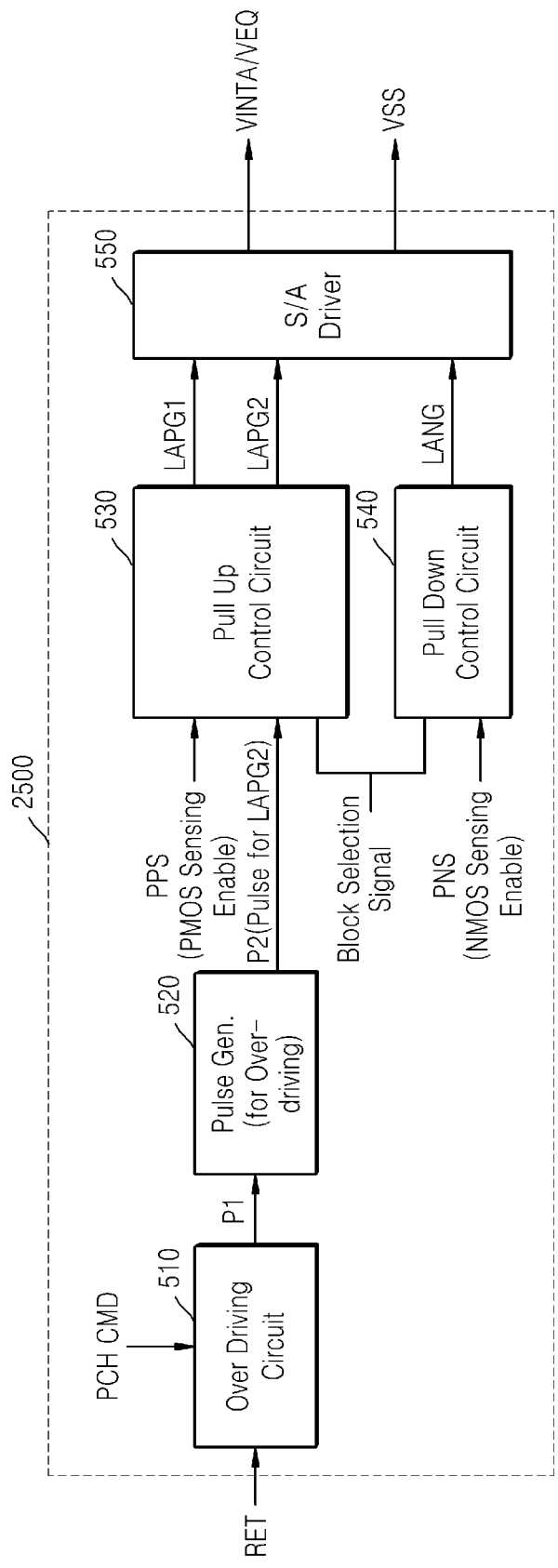
FIG. 6 is a block diagram of a sense amplifier control circuit illustrated in FIG. 5, according to an embodiment.

FIG. 6 is a block diagram of the sense amplifier control circuit 2500 illustrated in FIG. 5, according to an embodiment. Referring to FIGS. 5 and 6, the sense amplifier control circuit 2500 may include an over driving circuit 510 for outputting a first signal P1 indicating whether over-driving is performed in the self-refresh period, a pulse generator 520 for outputting a second signal P2 for controlling over-driving, a pull up control circuit 530, a pull down control circuit 540, and a sense amplifier driver 550.

When the semiconductor memory device 2000 is in a self-refresh mode, as the first self-refresh period is completed, the over-driving circuit 510 receives the refresh retention signal RET and controls to perform over-driving during a sensing operation of the memory cell 20 in response to the precharge command PCH CMD received from the command decoder (see 1100 of FIG. 1). The pulse generator 520 receives the first signal P1 from the over driving circuit 510 and generates the second signal P2 for controlling over-driving in response to the first signal P1.

In order to perform the sensing/amplification operation by using the sense amplifier 2600, the pull up control circuit 530 receives a PMOS sensing enable signal PPS and generates a first pull-up control signal LAPG1. When the second signal P2 is activated and is applied to the pull up control circuit 530 in order to perform over-driving, the pull up control circuit 530 generates a second pull-up control signal LAPG2 in order to perform over-driving and outputs the generated second pull-up control signal LAPG2 to the sense amplifier driver 550.

The pull down control circuit 540 receives an NMOS sensing enable signal PNS, generates a pull-down control signal LANG, and outputs the generated pull-down control signal LANG to the sense amplifier driver 550.

The pull up control circuit 530 and the pull down control circuit 540 may each further receive a block selection signal and may control to perform the sensing/amplification operation on the memory cell 20 of a block where the block selection signal is activated.

The sense amplifier driver 550 receives the first and second pull-up control signals LAPG1 and LAPG2 and the pull-down control signal LANG and applies first and second pull-up voltages VINTA and VEQ and a pull-down voltage VSS for sensing/amplifying data to the sense amplifier 2600. When a general driving operation is performed, the first pull-up voltage VINTA and the pull-down voltage VSS may be applied to the sense amplifier 2600, and when the over-driving operation is performed, the second pull-up voltage VEQ and the pull-down voltage VSS may be supplied to the sense amplifier 2600. A detailed operation and circuit of the sense amplifier driver 550 will be described below.

Figure 7:
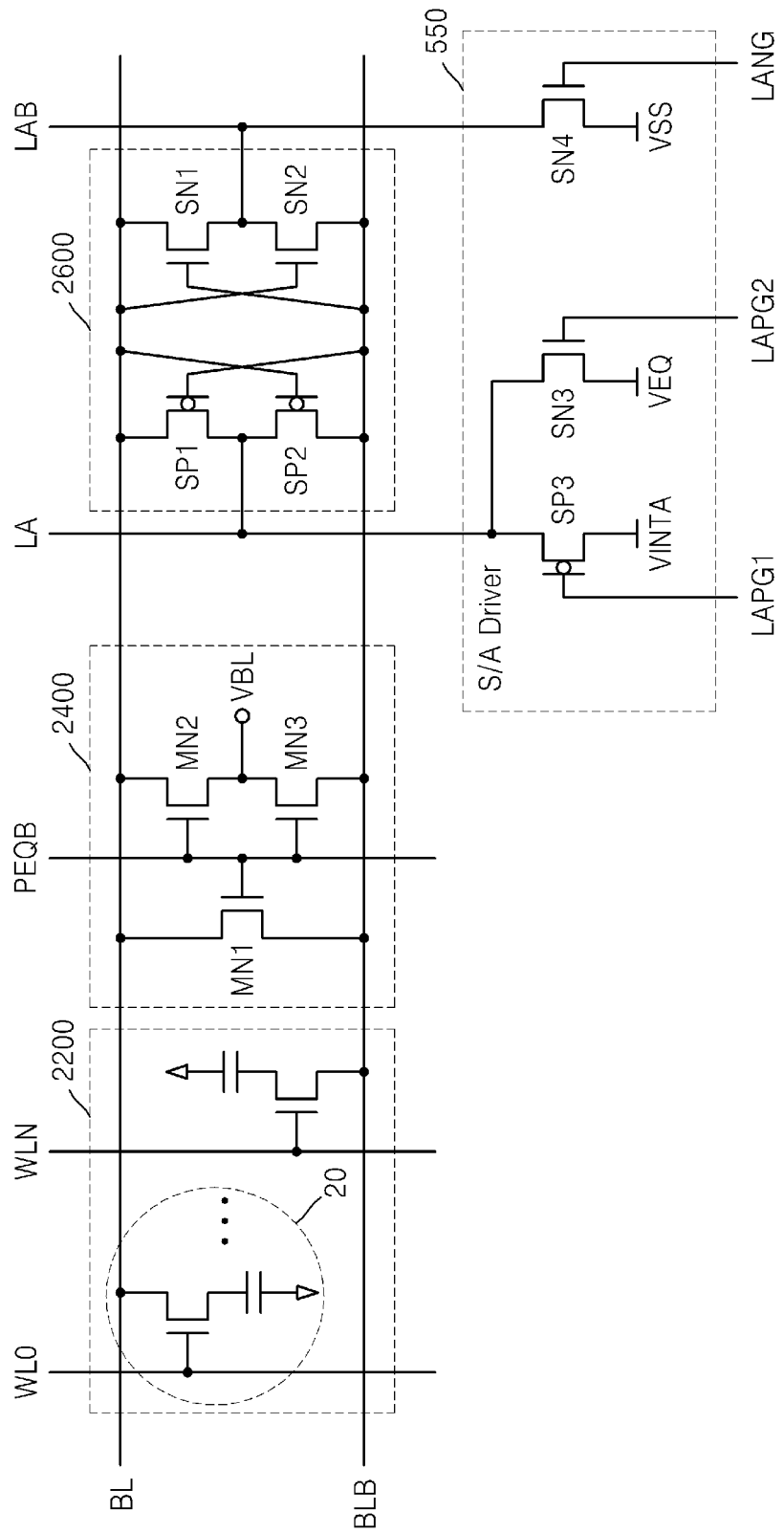
FIG. 7 is a circuit diagram of a sense amplifier and a sense amplifier control circuit illustrated in FIG. 5.

FIG. 7 is a circuit diagram of the sense amplifier 2600 and the sense amplifier control circuit 2500 illustrated in FIG. 5, according to an embodiment. Referring to FIGS. 5 through 7, the semiconductor memory device 2000 includes the memory cell array 2200 including the memory cells 20, the precharge circuit 2400, the sense amplifier 2600, and the sense amplifier driver 550. For convenience, among the elements of the sense amplifier control circuit 2500 only the sense amplifier driver 550 is illustrated in FIG. 7.

The memory cells 20 each include a cell capacitor and a cell transistor. When one word line WL0 is selected a bit line BL connected to the cell transistor is electrically connected to the cell capacitor. In this case, a level of a voltage applied to the bit line BL varies in accordance with data stored in the cell capacitor.

The precharge circuit 2400 includes one or more NMOS transistors, for example, first to third NMOS transistors MN1 to MN3. When the precharge control signal PEQB is enabled, the second and third NMOS transistors MN2 and MN3 are turned on, and the precharge voltage VBL is applied to the bit line BL and the complementary bit line BLB via the second and third NMOS transistors MN2 and MN3, respectively. The precharge voltage VBL may have a value that is about a half of a supply voltage, such as VCC, VDD, or internal VDD. The first NMOS transistor MN1 may equalize the bit line BL and the complementary bit line BLB in response to the enabled precharge control signal PEQB.

The sense amplifier 2600 may be implemented as a cross-coupled amplifier connected between the bit line BL and the complementary bit line BLB. The sense amplifier 2600 includes one or more PMOS transistors, for example, first and second PMOS transistors SP1 and SP2, which are connected in series between the bit line BL and the complementary bit line BLB. A gate of the first PMOS transistor SP1 is connected to the complementary bit line BLB, and a gate of the second PMOS transistor SP2 is connected to the bit line BL. In addition, the first and second PMOS transistors SP1 and SP2 are connected to a sensing line LA, and pull-up voltages are supplied to the first and second PMOS transistors SP1 and SP2 during the sensing operation.

The sense amplifier 2600 further includes one or more NMOS transistors, for example, first and second NMOS transistors SN1 and SN2, which are connected in series between the bit line BL and the complementary bit line BLB. A gate of the first NMOS transistor SN1 is connected to the complementary bit line BLB, and a gate of the second NMOS transistor SN2 is connected to the bit line BL. In addition, the first and second NMOS transistors SN1 and SN2 are connected to a complementary sensing line LAB, and a pull-down voltage is supplied to the first and second NMOS transistors SN1 and SN2 during the sensing operation.

As described above, the first pull-up voltage VINTA and the second pull-up voltage VEQ as the pull-up voltages may be supplied to the sense amplifier 2600 through the sensing line LA, and the ground voltage VSS as the pull-down voltage may be supplied to the sense amplifier 2600 through the complementary sensing line LAB. Although not shown, the semiconductor memory device 2000 may include a voltage generator that generates various voltages used in the semiconductor memory device 2000, and the first pull-up voltage VINTA and the second pull-up voltage VEQ generated by the voltage generator may be supplied to the sense amplifier 2600.

The sense amplifier driver 550 receives the first and second pull-up control signals LAPG1 and LAPG2 and the pull-down control signal LANG from the pull up control circuit 530 and the pull down control circuit 540, respectively, and supplies a pull-up/pull-down voltage to the sensing line LA and the complementary sensing line LAB in response to the first and second pull-up control signals LAPG1 and LAPG2 and the pull-down control signal LANG.

The sense amplifier driver 550 may include a third PMOS transistor SP3 and a third NMOS transistor SN3 connected to the sensing line LA, and a fourth NMOS transistor SN4 connected to the complementary sensing line LAB. The third PMOS transistor SP3 supplies the first pull-up voltage VINTA to the sensing line LA when the first pull-up control signal LAPG1 is at a logic 'low' level. The third NMOS transistor SN3 supplies the second pull-up voltage VEQ to the sensing line LA when the second pull-up control signal LAPG2 is at a logic 'high' level. The fourth NMOS transistor SN4 supplies the ground voltage VSS to the complementary sensing line LAB when the pull-down control signal LANG is at a logic 'high' level. In one embodiment, the third NMOS transistor SN3 may be replaced with a fourth PMOS transistor SP4 (not shown) and the fourth PMOS transistor SP4 may supply the second pull-up voltage VEQ to the sensing line LA when the second pull-up control signal LAPG2 is at a logic 'low' level. In another embodiment, the sense amplifier driver 550 may further include a fifth NMOS transistor SN5 (not shown) and the fifth NMOS transistor SN5 may supply a negative voltage VNEGA (not shown) to the complementary sensing line LAB in response to a second pull-down control signal LANG2 (not shown) being at a logic 'high' level. The second pull-down control signal LANG2 may activate while the second pull-up control signal LAPG2 is activated.

When the self-refresh operation is performed, after data stored in the memory cell 20 is sensed and amplified and the amplified data is restored in the memory cell 20, a precharge operation through the bit lines BL/BLB is performed. As described above, when the amplified data is restored in the memory cell 20, over-driving may be performed through the bit lines BL/BLB. For example, over-driving may be performed before the precharge operation begins when the precharge command PCH CMD is received while data is amplified.

Figure 8:
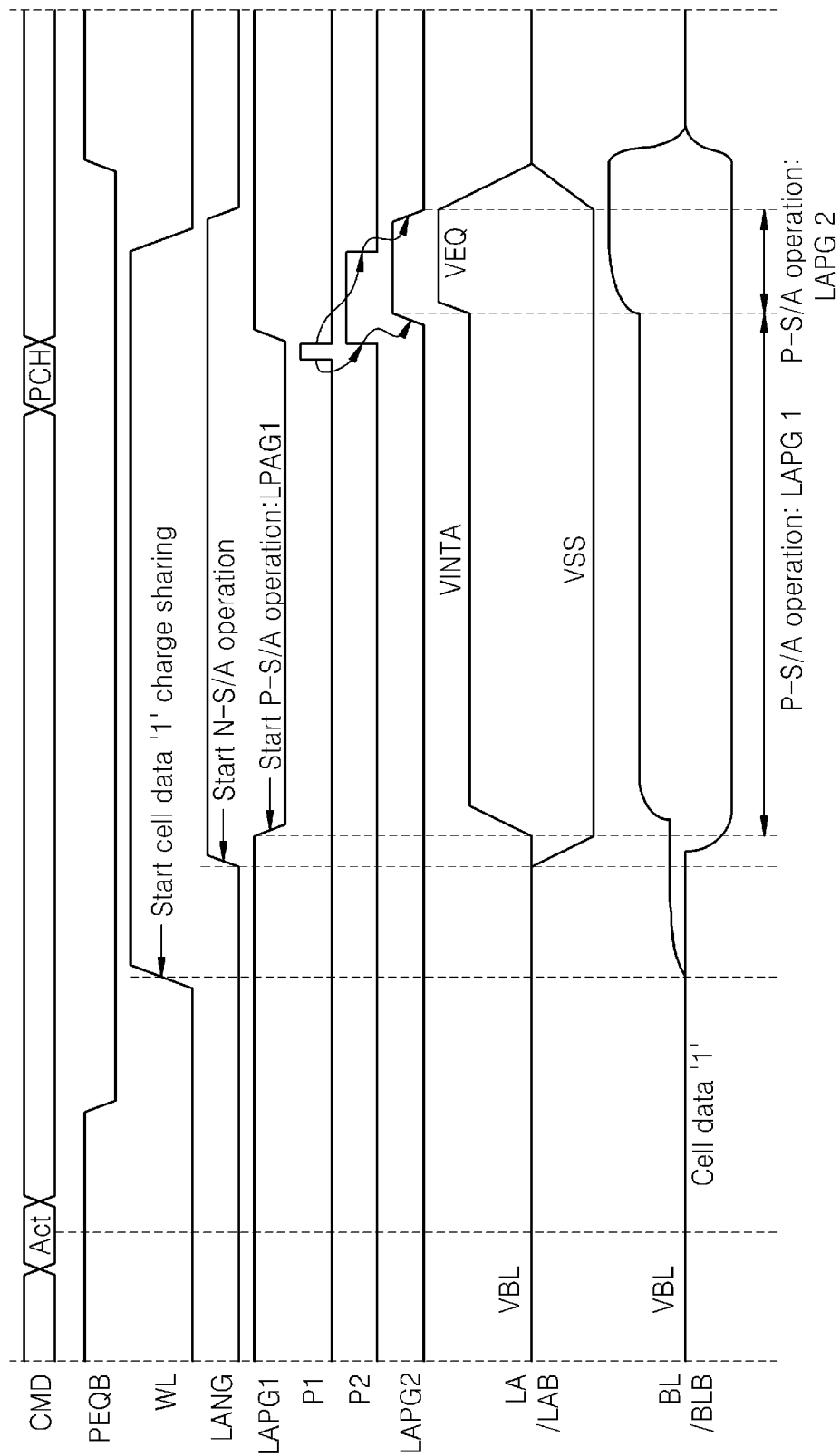
FIG. 8 is a timing diagram of an example of a refresh operation of a memory cell of FIG. 7 according to an embodiment.

FIG. 8 is a timing diagram of the refresh operation of the memory cell 20 of FIG. 7, according to an embodiment. Referring to FIGS. 5 through 8, when the precharge control signal PEQB is activated, the bit lines BL/BLB are precharged to the precharge voltage VBL. After the bit line BL is precharged, the word line WL is activated in response to an active command ACT, and the memory cell 20 and the bit line BL are electrically connected to each other.

When the memory cell 20 and the bit line BL are connected to each other, the voltage applied to the bit line BL varies in accordance with a charge sharing operation between the cell capacitor of the memory cell 20 and the bit line BL. Thus, when the memory cell 20 stores data at a logic high level, for example, 1, a predetermined amount of the voltage applied to the bit line BL is increased by the charge sharing operation, and when the memory cell 20 stores data at a logic low level, for example, 0, a predetermined amount of the bit line BL is decreased by the charge sharing operation.

In the sense amplifier control circuit 2500, the pull-down control signal LANG is at a "high" level in response to the NMOS sensing enable signal PNS, and the first pull-up control signal LAPG1 is at a "low" level in response to the PMOS sensing enable signal PPS.

When the charge sharing operation is stabilized, the amplification operation of the sense amplifier 2600 is performed. If the pull-down control signal LANG is at a "high" level, the voltage of the complementary sensing line LAB is changed from the precharge voltage VBL to a pull-down voltage, for example, the ground voltage VSS. In addition, if the first pull-up control signal LAPG1 is at a "low" level, the voltage of the sensing line LA is changed from the precharge voltage VBL to the first pull-up voltage VINTA. Thus, voltages applied to a pair of bit lines BL and BLB are amplified by the sense amplifier 2600 and are developed into the first pull-up voltage VINTA and the pull-down voltage VSS, respectively.

Subsequently, the sense amplifier control circuit 2500 generates the first signal P1 for performing over-driving in response to the precharge command PCH CMD, and the pulse generator 520 generates the second signal P2 by using the first signal P1. The second signal P2 may be generated by delaying the first signal P1 for a predetermined amount of time and also by increasing a pulse width of the first signal P1. The pull up control circuit 530 generates the second pull-up control signal LAPG2 for performing an over-driving operation by receiving the second signal P2 and applies the second pull-up control signal LAPG2 to the sense amplifier driver 550.

The second pull-up voltage VEQ is supplied to the bit line BL through the sensing line LA in response to the second pull-up control signal LAPG2. The restoring level of the memory cell 20 is increased by the second pull-up voltage VEQ applied to the bit line BL. As a result, an internal voltage applied to each memory cell 20 may be increased so that data retention characteristics may be improved and the period of the self-refresh operation may also be increased. If the precharge control signal PEQB is changed to a "high" level, each pair of bit lines BL and BLB is precharged to the precharge voltage VBL. That is, the over-driving operation is performed in a period in which the second signal P2 is activated, during the sensing/amplification period.

Figure 9:
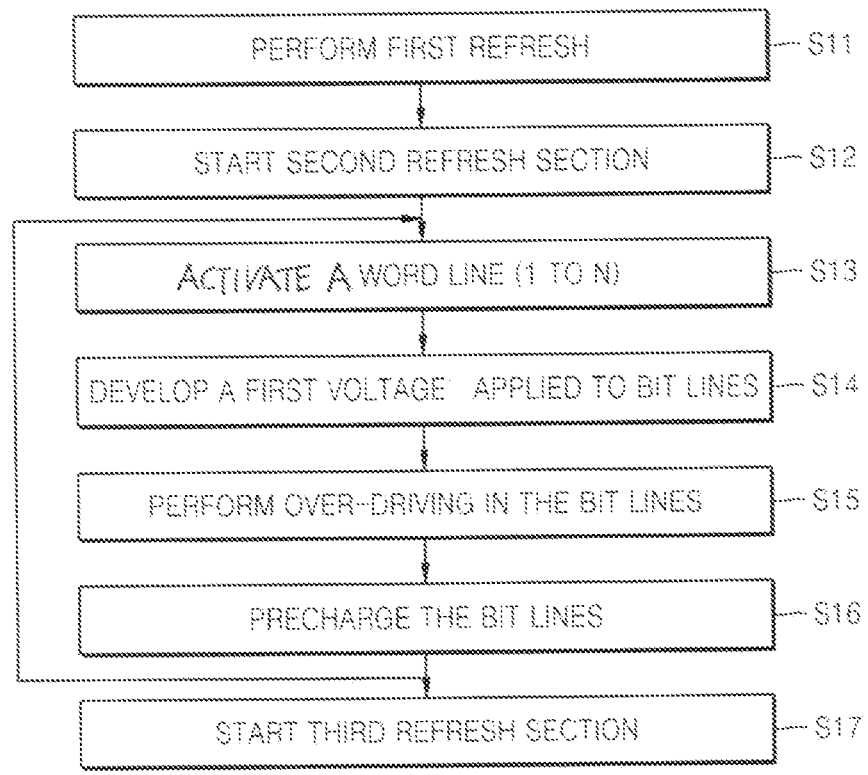
FIG. 9 is a flowchart illustrating a refresh method of a semiconductor memory device, according to an embodiment.

FIG. 9 is a flowchart illustrating a refresh method of a semiconductor memory device, according to an embodiment. In a first refresh period, a first refresh operation is performed in operation S11. The first refresh period may have a number of refresh command periods. Each of the internal address XADD or the row address for the first refresh operation may be generated for each refresh command. A number of periods of the internal address XADD or the row address in the first refresh period may be the same as the number of refresh command periods. In one embodiment, all the memory cells of the semiconductor memory device are refreshed during the first refresh period. When a word line is activated for the refresh operation, the memory cells connected to the word line are selected and a first voltage applied to bit lines connected to the selected word line is developed, and a bit line precharge operation is performed after data are restored in the memory cells. After the refresh operation is performed on all word lines, a second refresh period is started in operation S12.

The second refresh period may have same number of refresh commands as in the first refresh period. The second refresh period may be larger than the first refresh period. As the second refresh operation is performed, a plurality of word lines (e.g., 1 through n) are sequentially activated in accordance with a predetermined period, for example, a row address generation period in operation S13. A refresh command period in the second refresh period in which one word line is selected, for example, a row address generation period, may be larger than that of the first refresh period. As shown in FIG. 3, a refresh command period T2 of the second refresh period may be longer than a refresh command period T1 of the first refresh period.

When one word line is activated, the memory cells connected to the word line are selected, and a charge sharing operation is performed between charges stored in the memory cells and charges existing in the bit lines. Thus, the first voltage applied to the bit lines connected to the selected word line is developed in operation S14, and a difference in level of voltages between each bit line and its complementary bit line corresponding to the bit line increases.

After the first voltage applied to the bit lines is developed, as pull-up and pull-down voltages are supplied to the bit lines and the complementary bit lines, an amplification operation is performed. The amplification operation may be performed when a pull-up voltage, for example, a first pull-up voltage, is supplied to the bit lines and a pull-down voltage, for example, a first pull-down voltage, is supplied to the complementary bit lines.

The over-driving operation is performed through the bit lines during a partial period of the amplification operation in operation S15. The over-driving operation may be performed by supplying the second pull-up voltage to the bit lines during the partial period of the amplification operation. In this case, the second pull-up voltage may have a larger level than that of the first pull-up voltage, and thus, the restoring level of the memory cells may be increased. After the above-described over-driving operation is performed, the precharge operation is performed through the bit lines of the selected word line in operation S16. After operation S16, the address counter 250 may generate next row address in response to a refresh command and the semiconductor memory device repeats the operation S13 through S16. After operations S13 through S16 are performed on all word lines, a third refresh period is started in operation S17. The third refresh period may have a larger period than that of the second refresh period. As a result, a period for selecting a word line in the third refresh period, for example, a row address generation period, may have a larger value than that of the second refresh period. In addition, the refresh operation may be performed by applying over-driving to the third refresh period.

Figure 10:
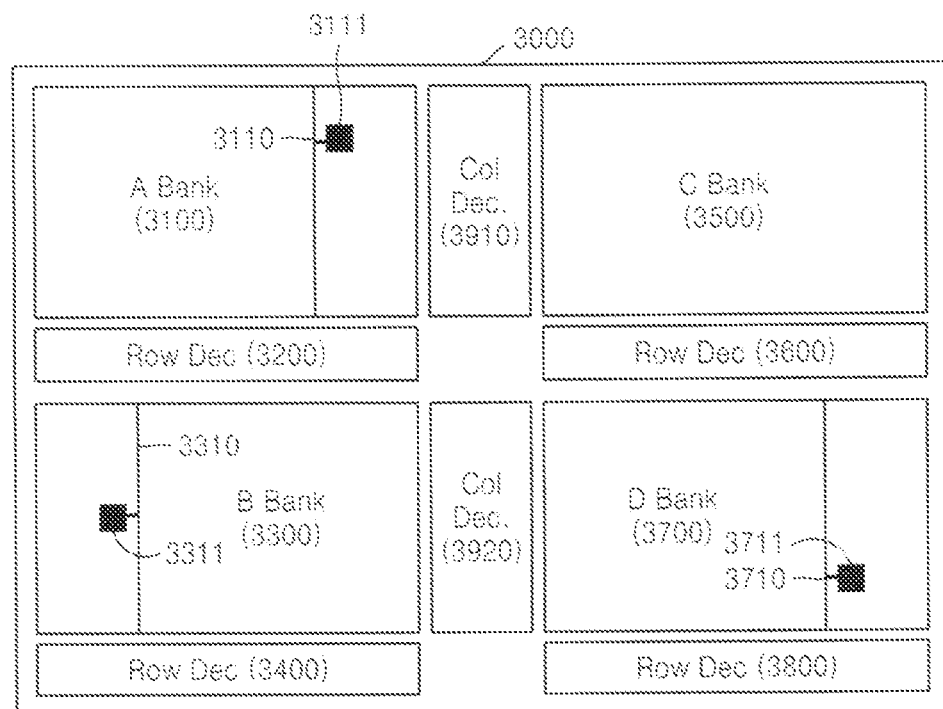
FIG. 10 is a block diagram of a semiconductor memory device according to another embodiment.

FIG. 10 is a block diagram of a semiconductor memory device 3000 according to another embodiment. Referring to FIG. 10, the semiconductor memory device 3000 includes one or more memory banks 3100, 3300, 3500, and 3700, one or more row decoders 3200, 3400, 3600, and 3800, and one or more column decoders 3910 and 3920. Each of the memory banks 3100, 3300, 3500, and 3700 may include a plurality of memory blocks. In this case, each of the plurality of memory blocks may refer to a unit that uses the same bit line and shares a sense amplifier.

Each of the memory banks 3100, 3300, 3500, and 3700 may include a normal cell in which a normal operation is performed, and a defective cell in which the normal operation may not be performed. The defective cell may require a refresh operation more frequently than the normal cell. In this case, when the refresh operation is performed on all cells of each of the memory banks 3100, 3300, 3500, and 3700 having the defective cell, the period of the refresh operation is decreased and power consumption is increased.

According to one embodiment, information regarding row addresses 3110, 3310, and 3710 including defective cells 3111, 3311, and 3711, respectively, may be stored using an anti-fuse, etc., in a non-volatile manner, and the over-driving operation may be selectively performed only on the row addresses 3110, 3310, and 3710 during the refresh operation.

For example, the row address information stored in the anti-fuse, etc. may be provided to the refresh control circuit 1200 and/or the sense amplifier control circuit 1900 illustrated in FIG. 1, and the over-driving operation may be applied to a case that the refresh operation is performed on the row addresses 3110, 3310, and 3710 including the defective cells 3111, 3311, and 3711. Thus, power consumption caused by the over-driving operation may be further reduced.

Figure 11:
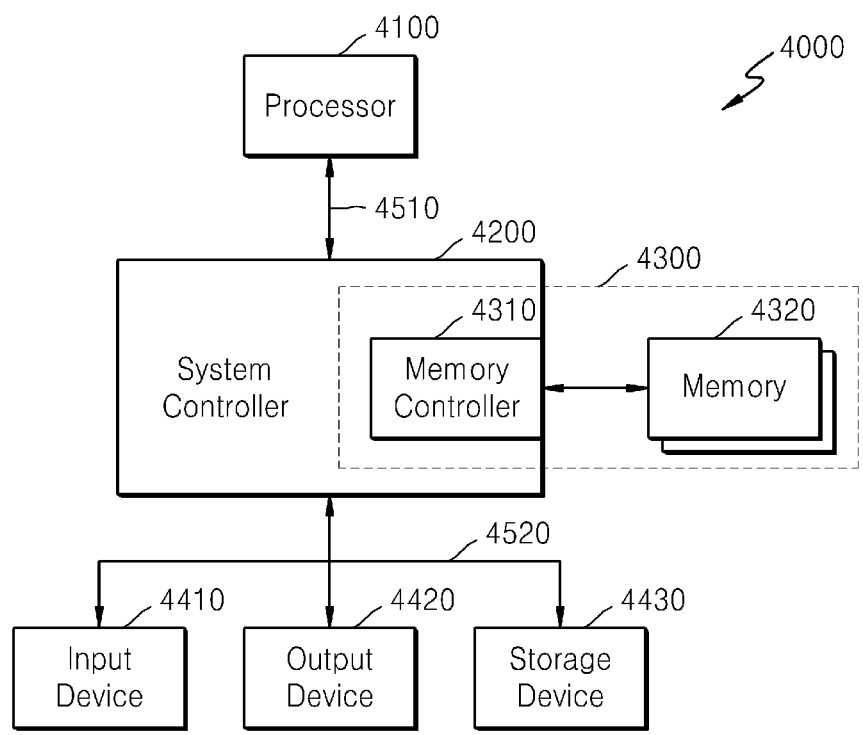
FIG. 11 is a block diagram of a computing system including a memory device, according to an embodiment.

FIG. 11 is a block diagram of a computing system 4000 including a semiconductor memory device, according to one embodiment. Referring to FIG. 11, the computing system 4000 includes a processor 4100, a system controller 4200, and a memory system 4300. The computing system 4000 may further include a processor bus 4510, an extended bus 4520, an input device 4410, an output device 4420, and a storage device 4430. The memory system 4300 includes at least one semiconductor memory device 4320 according to one or more discussed embodiments, and a memory controller 4310. Thus, when a refresh operation is performed on the semiconductor memory device 4320, over-driving may be performed and a period of the refresh operation may be increased. The memory controller 4310 may be included in the system controller 4200.

The processor 4100 may execute various computing operations, like executing predetermined software for executing predetermined computations or tasks. For example, the processor 4100 may be a micro-processor or a central processing unit (CPU). The processor 4100 may be connected to the system controller 4200 via the processor bus 4510, which includes an address bus, a control bus and/or a data bus. The system controller 4200 is connected to the extended bus 4520, such as a peripheral component interconnection (PCI) bus. Thus, the processor 3100 may control one or more input devices 4410, such as keyboards or mouses, one or more output devices 4420, such as printers or display devices, or one or more storage devices 4430, such as hard disk drives, solid state drives, or CD-ROMs, via the system controller 4200.

The memory controller 4310 may control the semiconductor memory device 4320 to execute the command supplied by the processor 4100. The semiconductor memory device 4320 may store data provided by the memory controller 4310 and may provide the stored data to the memory controller 4310. The semiconductor memory device 4320 may include one or more memory chips, dynamic random access memories (DRAMs), static random access memories (SRAMs), or non-volatile memory chips. The computing system 300 may be a desktop computer, a notebook computer, a workstation, a hand-held device, or the like.

While the present disclosure has been particularly shown and described with reference to exemplary embodiments thereof, it will be understood that various changes in form and details may be made therein without departing from the spirit and scope of the following claims.

What is claimed is:

1. A semiconductor memory device comprising:
a memory cell array including a plurality of memory cells;
a sense amplifier connected to a sensing line and a complementary sensing line and configured to sense and amplify data stored in at least one of the memory cells; and
a sense amplifier control circuit configured to supply a first voltage and sequentially supply a second voltage having a different level from a level of the first voltage to the sense amplifier through the sensing line during a refresh command period of a refresh period,
wherein the refresh period comprises a first refresh period and subsequently a second refresh period longer than the first refresh period.

2. The semiconductor memory device of claim 1,
wherein each of the first and second refresh periods includes the same number of refresh command periods to refresh all of the word lines of the memory cell array.

3. The semiconductor memory device of claim 2, wherein a refresh command period during the second refresh period is longer than a refresh command period during the first refresh period.

4. The semiconductor memory device of claim 2, wherein the sense amplifier control circuit is configured to supply the first voltage during the first refresh period and supply the first and the second voltages during the second refresh period.

5. The semiconductor memory device of claim 4, wherein the sense amplifier control circuit is configured to supply the second voltage during a precharge operation of the second refresh period.

6. The semiconductor memory device of claim 1, wherein the second voltage has a greater level than a level of the first voltage.

7. The semiconductor memory device of claim 1, wherein the sense amplifier control circuit comprises a sense amplifier driver configured to supply the first and second voltages to the sense amplifier, and
wherein the sense amplifier driver comprises:
a first transistor configured to supply the first voltage to the sense amplifier in response to a first control signal;
a second transistor configured to supply the second voltage to the sense amplifier in response to a second control signal; and
a third transistor configured to supply a third voltage to the sense amplifier through the complementary sensing line in response to a third control signal.

8. The semiconductor memory device of claim 7, wherein the third voltage is a ground voltage.

9. The semiconductor memory device of claim 1, wherein the second voltage is supplied to a sense amplifier associated with a defective memory cell.

10. A refresh method for a semiconductor memory device comprising a memory cell array, the refresh method comprising:
entering a second refresh period after a first refresh period;
selecting a first memory cell of the memory cell array by activating a word line;
performing an amplification operation on a bit line of the first memory cell by sequentially supplying a first voltage and a second voltage having different level from a level of the first voltage to a sense amplifier during a refresh command period of the second refresh period; and
restoring data in the first memory cell by using voltages applied to the bit line, wherein a period of the second refresh period is longer than a period of the first refresh period.

11. The refresh method of claim 10, wherein each of the first and second refresh periods includes a number of refresh command periods to refresh all of word lines of the memory cell array.

12. The refresh method of claim 11, wherein the first refresh period comprises:
selecting the first memory cell by activating the word line;
performing an amplification operation through the bit line of the first memory cell by supplying the first voltage to the sense amplifier; and
restoring data in the first memory cell by using the first voltage applied to the bit line.

13. The refresh method of claim 10, further comprising receiving a precharge command for performing a precharge operation on the bit line,
wherein the performing the amplification operation comprises amplifying a voltage applied to the bit line into the second voltage in response to the precharge command while the voltage applied to the bit line is amplified to the first voltage.

14. The refresh method of claim 13, further comprising pre-charging the bit line after the data is restored, in response to the precharge command.

15. The refresh method of claim 10, wherein the first memory cell is a defective memory cell.

16. A refresh method for a memory device comprising a sense amplifier connected to one or more memory cells, the refresh method comprising:
supplying a first voltage to a sensing line of the sense amplifier during a refresh command period of a first refresh period; and
supplying the first voltage and sequentially a second voltage having a different level from a level of the first voltage to the sensing line of the sense amplifier during a refresh command period of a second refresh period longer than the first refresh period.

17. The refresh method of claim 16, further comprising receiving a precharge command before supplying the second voltage.

18. The refresh method of claim 16, wherein the first and second refresh period have the same number of refresh command periods.

19. The refresh method of claim 16, wherein the level of the second voltage is higher than the level of the first voltage.

* * * * *